United States Patent
Huang et al.

(10) Patent No.: US 7,326,523 B2
(45) Date of Patent: Feb. 5, 2008

(54) LOW REFRACTIVE INDEX POLYMERS AS UNDERLAYERS FOR SILICON-CONTAINING PHOTORESISTS

(75) Inventors: Wu-Song Huang, Poughkeepsie, NY (US); Sean D. Burns, Yorktown Heights, NY (US); Mahmoud Khojasteh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/013,971

(22) Filed: Dec. 16, 2004

(65) Prior Publication Data

US 2006/0134546 A1    Jun. 22, 2006

(51) Int. Cl.
G03F 7/20 (2006.01)
G03F 7/30 (2006.01)
G03F 7/36 (2006.01)
G03C 1/835 (2006.01)
G03C 1/825 (2006.01)

(52) U.S. Cl. ............... 430/313; 430/311; 430/325; 430/326; 430/317; 430/318

(58) Field of Classification Search ............ None
See application file for complete search history.

(56) References Cited

U.S. PATENT DOCUMENTS

| | | | |
|---|---|---|---|
| 4,592,993 A * | 6/1986 | Ohnishi et al. | 430/313 |
| 4,855,017 A | 8/1989 | Douglas | 438/695 |
| 5,362,663 A | 11/1994 | Bronner et al. | 438/241 |
| 5,429,710 A | 7/1995 | Akiba et al. | 438/714 |
| 5,443,690 A * | 8/1995 | Takechi et al. | 430/286.1 |
| 5,562,801 A | 10/1996 | Nulty | 438/695 |
| 5,618,751 A | 4/1997 | Golden et al. | 438/392 |
| 5,663,036 A | 9/1997 | Conley et al. | 430/271.1 |
| 5,744,376 A | 4/1998 | Chan et al. | 438/643 |
| 5,783,361 A | 7/1998 | Conley et al. | 430/271.1 |
| 5,795,701 A | 8/1998 | Conley et al. | 430/325 |
| 5,801,094 A | 9/1998 | Yew et al. | 438/624 |
| 5,861,231 A | 1/1999 | Barclay et al. | 430/270.1 |
| 5,886,102 A | 3/1999 | Sinta et al. | 525/154 |
| 5,939,236 A | 8/1999 | Pavelcheck et al. | 430/273.1 |
| 5,948,570 A | 9/1999 | Kornblit et al. | 430/5 |
| 5,962,184 A | 10/1999 | Allen et al. | 430/270.1 |
| 5,985,524 A | 11/1999 | Allen et al. | 430/326 |
| 6,037,097 A | 3/2000 | Bucchignano et al. | 430/270.1 |
| 6,054,248 A | 4/2000 | Foster et al. | 430/271.1 |
| 6,165,282 A | 12/2000 | Marshall et al. | 134/13 |
| 6,340,734 B1 | 1/2002 | Lin et al. | 528/15 |
| 6,420,088 B1 | 7/2002 | Angelopoulos et al. | 430/272.1 |
| 6,444,408 B1 | 9/2002 | Brock et al. | 430/322 |
| 6,503,692 B2 | 1/2003 | Angelopoulos et al. | 430/310 |
| RE38,282 E | 10/2003 | Allen et al. | 430/326 |
| 6,653,048 B2 | 11/2003 | Brock et al. | 430/270.1 |
| 6,730,454 B2 | 5/2004 | Pfeiffer et al. | 430/270.1 |
| 6,808,869 B1 * | 10/2004 | Mizutani et al. | 430/325 |
| 6,818,381 B2 | 11/2004 | Khojasteh et al. | 430/271.1 |
| 2002/0058204 A1 | 5/2002 | Khojasteh et al. | 430/270.1 |
| 2002/0076641 A1 * | 6/2002 | Choi et al. | 430/270.1 |
| 2002/0094382 A1 * | 7/2002 | Imai et al. | 427/282 |
| 2003/0017711 A1 | 1/2003 | Mahorowala et al. | 438/719 |
| 2003/0073040 A1 | 4/2003 | Iwasawa et al. | 430/312 |
| 2004/0058272 A1 * | 3/2004 | Takahashi et al. | 430/270.1 |

FOREIGN PATENT DOCUMENTS

| | | |
|---|---|---|
| CA | 1 204 547 | 5/1986 |
| JP | 60-116132 | 6/1985 |
| JP | 01-293339 | 11/1989 |
| JP | 2002-14474 * | 1/2002 |

OTHER PUBLICATIONS

Machine-assisted English translation of JP 2002-14474, provided by JPO.*
U.S. Appl. No. 10/721,302 Entitled: "Molecular photoresists containing nonpolymeric silsesquioxanes", filed Nov. 24, 2003.

* cited by examiner

Primary Examiner—Sin Lee
(74) Attorney, Agent, or Firm—Steve Capella

(57) ABSTRACT

A new underlayer composition that exhibits high etch resistance and improved optical properties is disclosed. The underlayer composition comprises a vinyl or acrylate polymer, such as a methacrylate polymer, the polymer comprising at least one substituted or unsubstituted naphthalene or naphthol moiety, including mixtures thereof. The compositions are suitable for use as a planarizing underlayer in a multilayer lithographic process, including a trilayer lithographic process.

9 Claims, No Drawings

LOW REFRACTIVE INDEX POLYMERS AS UNDERLAYERS FOR SILICON-CONTAINING PHOTORESISTS

BACKGROUND OF THE INVENTION

1. Field of the Invention

This invention relates to an underlayer composition for silicon-containing photoresists, especially silicon-containing multilayer resists. More particularly, this invention relates to an underlayer composition that comprises a vinyl or acrylate polymer comprising a naphthalene moiety or naphthol moiety.

2. Description of the Related Art

In the microelectronics industry, there is a continued desire to reduce the size of structural features and/or to provide greater amount of circuitry for a given chip size. Advanced lithographic techniques are required to fabricate high performance and high density circuitry. Lithography impacts the manufacture of microscopic structures not only in terms of directly imaging patterns on the desired substrate, but also in terms of making masks typically used in such imaging.

The resolution capability of lithographic processes is generally a function of the wavelength of imaging radiation, the numerical aperture of the lens in the exposure tool and various resolution enhancing techniques used. Thinner resist also provides larger focus latitude and higher resolution. Thinning of a conventional single layer resist to improve resolution generally results in compromise of the etch resistance of the resist which is needed to transfer the desired image to the underlying material layer. In order to obtain the resolution enhancement benefit of thinner imaging layers, multilayer lithographic processes (e.g., bilayer processes) have been developed. In multilayer lithographic processes, a planarizing underlayer is used between the imaging resist layer (typically a silicon-containing resist) and the underlying material layer to be patterned by transfer from the patterned resist. The underlayer receives the pattern from the patterned resist layer, and then the patterned underlayer acts as a mask for the etching processes needed to transfer the pattern to the underlying material. Exemplary multilayer lithographic processes are described in U.S. Pat. Nos. 5,985,524, 6,444,408, 6,653,048, and U.S. Reissue Pat. No. RE38,282. These patents mention the use of polyacrylates as underlayers. U.S. Pat. No. 6,054,248 also discloses various polymers for use as underlayers.

While planarizing underlayer materials exist in the art, there is a continued desire for improved compositions, especially compositions useful in lithographic processes using imaging radiation having a wavelength less than 200 nm (e.g., 193 nm). Known underlayers for I-line and 248 nm DUV multilayer lithographic applications are typically based on novolac or polyhydroxystyrene polymers. For example, U.S. Pat. No. 6,340,734 discloses the use of diazonaphthoquinone (DNQ)/novolac or novolac resin as an underlayer material. These materials very strongly absorb 193 nm radiation, thus are not suitable for 193 nm lithographic applications.

The planarizing underlayer compositions should be sufficiently etchable with selectivity to the overlying photoresist (to yield a good profile in the etched underlayer) while being resistant to the etch process needed to pattern the underlying material layer. Additionally, the planarizing underlayer composition should have the desired optical characteristics (e.g., refractive index, optical density) such that the need for any additional antireflective layer is avoided. Examples of good refractive indexes for the underlayers are those that would provide the substrate reflectivity of about 1% or less. The planarizing underlayer composition should also have physical and chemical compatibility with the imaging resist layer to avoid unwanted interactions which may cause footing and/or scumming.

It is also desired to reduce the number of separate ingredients in the planarizing underlayer composition in order to enhance the economic viability of multilayer lithographic processes.

U.S. Pat. No. 6,818,381 describes compositions suitable for forming planarizing underlayers for multilayer lithographic processes, characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker. The compositions provide outstanding optical, mechanical and etch selectivity properties, and are especially useful in lithographic processes using radiation less than 200 nm in wavelength to configure underlying material layers. The teaching uses highly absorbing aromatic moieties which then can only be incorporated with small quantity in the polymer composition. One drawback of lower ratio of aromatic moieties is that the resulting polymer would have lower etch resistance for patterning the material layer under the underlayer. The other drawback is that it would be very difficult to get the right optical properties in the synthetic process, such as rendering the polymer either too high in absorption when too much aromatic moieties are incorporated, or too low in absorption when not enough aromatic moieties are incorporated.

U.S. Patent Application Pub. No. 2003/0073040A1 describes an underlayer film containing a polymer with a carbon content of 80 wt % or more. The polymer is an acenaphthylene polymer or its copolymer, which provides a very rigid composition. It is very difficult to tune the n and k values with this rigid composition.

Simple vinyl and acrylate polymers containing aromatic units with high etch resistance and good optical properties are needed for underlayers. There is also a need to have good underlayer composition for a trilayer resist structure.

SUMMARY OF THE INVENTION

It is an object of the invention to provide a new underlayer composition that exhibits high etch resistance and improved optical properties.

Accordingly, in one aspect, the invention is directed to a composition suitable for use as a planarizing underlayer in a multilayer lithographic process, the composition comprising a vinyl or acrylate polymer, the polymer comprising at least one substituted or unsubstituted naphthalene or naphthol moiety.

In another aspect, the invention is directed to a method of forming a patterned material feature on a substrate. The method comprises: providing a material layer on a substrate; forming an underlayer on the material layer, the underlayer comprising a vinyl or acrylate polymer, the polymer comprising at least one substituted or unsubstituted naphthalene or naphthol moiety; forming a radiation-sensitive imaging layer on the underlayer; patternwise exposing the imaging layer to radiation, thereby creating a pattern of radiation-exposed regions in the imaging layer; selectively removing portions of the imaging layer and underlayer to expose portions of the material layer; and etching the exposed portions of the material layer, thereby forming the patterned material feature.

In yet another aspect, the invention is directed to a method of forming a patterned material feature on a substrate. The method comprises: providing a material layer on a substrate; forming an underlayer on the material layer, the underlayer comprising a vinyl or acrylate polymer, the polymer comprising at least one substituted or unsubstituted naphthalene or naphthol moiety; forming an interlayer on the underlayer, the interlayer comprising a silicon-containing polymer; forming a radiation-sensitive imaging layer on the interlayer; patternwise exposing the imaging layer to radiation, thereby creating a pattern of radiation-exposed regions in the imaging layer; selectively removing portions of the imaging layer, interlayer and underlayer to expose portions of the material layer; and etching the exposed portions of the material layer, thereby forming the patterned material feature.

DETAILED DESCRIPTION OF THE INVENTION

The present invention relates to underlayer compositions which are useful in multilayer lithographic processes. The compositions of this invention provide outstanding optical properties, in lithographic structures containing the underlayers obtained from the compositions of the invention. In another aspect, the invention includes methods of making such lithographic structures and methods of using such lithographic structures to pattern underlying material layers on a substrate.

In one aspect, this invention is directed to underlayer compositions comprising a vinyl or acrylate polymer, such as a methacrylate polymer. The polymer comprises at least one substituted or unsubstituted naphthalene or naphthol moiety, including mixtures thereof.

In order to fine tune the refractive index (n) and extinction-coefficient (k) of the underlayer, the polymer of the underlayer composition may further comprise a co-monomer with saturated carbon bonds. Such co-monomers with saturated carbon bonds will reduce the k value of the polymer. Suitable co-monomers include vinyl, acrylate (including methacrylate), maleic anhydride, cyclic olefin, vinylether, and mixtures thereof. The co-monomers with saturated carbon bonds may also contain a reactive site selected from the group consisting of alcohols, amino groups, imino groups, carboxylic acids, and mixtures thereof.

To increase the k value, the polymer of the underlayer composition may further comprise an aromatic co-monomer or co-monomers with double or triple bonds. Examples of such aromatic co-monomers are vinyl and acrylate monomers (including methacrylate monomers) containing substituted and unsubstituted phenyl, hydroxyphenyl, anthracene and hydroxyanthracene groups. Examples of co-monomers with double or triple bonds include vinyl and acrylate monomers containing alkene, alkyne, cyano, and/or carbonitrile groups.

The underlayer compositions preferably have a k value of about 0.08-0.8, more preferably about 0.12-0.5, and an n value of about 1.3-2.0, more preferably about 1.45-1.8.

If the underlayer is to be used in a multilayer lithographic process using 157 nm imaging radiation, the polymer preferably contains a fluorine component. The fluorine may be present as a pentafluoroaryl group (e.g., as perfluorostyrene), a trifluoromethyl group (e.g., as a trifluoromethyacrylate) or in another form compatible with the other constituents of the planarizing layer composition and with the synthesis techniques used to form the polymer.

The underlayer compositions of the invention are preferably substantially free of silicon, especially where the imaging layer is a silicon-containing resist.

The polymers of the invention preferably have a weight average molecular weight, before any crosslinking reaction, of at least about 1000, more preferably a weight average molecular weight of about 5000-50000.

To prevent intermixing between the underlayer and a resist layer above it, the underlayer composition may further comprise an acid generator for inducing crosslinking of the inventive polymers. The acid generator is preferably an acid generator compound that liberates acid upon thermal treatment. A variety of known thermal acid generators may be suitably employed, such as 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236.

If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Preferred radiation-sensitive acid generators (PAG) include: (trifluoromethyl-sulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide ("DDSN") may be used. The radiation-sensitive acid generator should be compatible with the other components of the planarizing underlayer composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

The crosslinking component is preferably a crosslinker that can be reacted with the inventive polymer in a manner which is catalyzed by generated acid and/or by heating. Generally, the crosslinking component used in the underlayer compositions may be any suitable crosslinking agent which is otherwise compatible with the other components of the composition. The crosslinking agents preferably act to crosslink the polymer component in the presence of a generated acid. Suitable organic cross-linking agents include, but are not limited to: amine-containing compounds, epoxy-containing compounds, compounds containing at least two vinyl ether groups, allyl substituted aromatic compounds, compounds containing at least two or more diazonaphthoquinone sulfonic acid ester groups and combinations thereof. Preferred crosslinking agents are glycoluril compounds such as tetramethoxymethyl glycoluril, methylpropyltetra-methoxymethyl glycoluril, and methylphenyltetramethoxymethyl glycoluril, available under the POWDERLINK trademark from American Cyanamid Company. Other preffered crosslinking agents include 2,6-bis (hydroxymethyl)-p-cresol and compounds

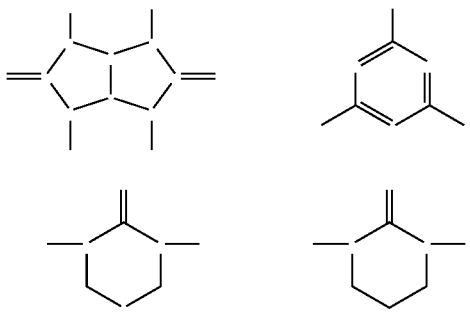

such as those found in Japanese Laid-Open Patent Application (Kokai) No. 1-293339, as well as etherified amino resins, for example methylated or butylated melamine resins (N-methoxymethyl-or N-butoxymethyl-melamine respectively) or methylated/butylated glycolurils, for example as can be found in Canadian Patent No. 1,204,547. Other crosslinking agents such as bis-epoxies or bis-phenols (e.g., bisphenol-A) may also be used. Combinations of crosslinking agents may be used.

The crosslinking component may be part of the inventive polymer structure. Accordingly, the polymer of the underlayer composition may further comprise a co-monomer containing a crosslinking moiety. Suitable crosslinking moieties include: amine containing compounds, epoxy containing materials, compounds containing vinyl ether groups, allyl substituted aromatic compounds, compounds containing diazonaphthoquinone sulfonic acid ester groups and combinations thereof. Examples of co-monomers containing epoxy type crosslinker are the cyclic ether moieties, and are preferably present in groups pending from monomers making up at least a portion of the backbone of the polymer. Preferably, the cyclic ether moieties are pendant from acrylate monomers (e.g., an acrylate or methacrylate) as part of an ester group. If desired, other components may be present in the ester group. Examples of cyclic ether moieties include trioxane, tetrahydrofuran, oxetane, oxepane, trithiane, tetrathiane, and epoxy moieties.

The underlayer compositions of the invention preferably contain (on a solids basis) (i) about 50-98 wt. % of the polymer, more preferably about 70-96 wt. %, (ii) about 1-50 wt. % of crosslinking component, more preferably about 3-25 wt. %, most preferably about 5-25 wt. %, and (iii) about 1-20 wt. % acid generator, more preferably about 1-15 wt. %.

The underlayer compositions of the invention may be used in combination with any desired resist material in the formation of a lithographic structure. Preferably, the resist is imageable with ultraviolet radiation (e.g., <400 nm wavelength) or with electron beam radiation. Examples of suitable resist materials are described in U.S. Pat. Nos. 5,861,231, 5,962,184 and 6,037,097. Preferred resists for bilayer applications using 193 nm radiation are disclosed in U.S. Pat. No. 6,444,408, the disclosure of which is incorporated herein by reference.

The underlayer compositions of the invention may contain a solvent prior to their application to the desired substrate. The solvent may be any solvent conventionally used with resists which otherwise does not have any excessively adverse impact on the performance of the underlayer composition. Preferred solvents are propylene glycol monomethyl ether acetate or cyclohexanone. The amount of solvent in the composition for application to a substrate is preferably sufficient to achieve a solids content of about 5-20 wt. %. Higher solids content formulations will generally yield thicker coating layers. The compositions of the invention may further contain minor amounts of auxiliary components (e.g., surfactants, dyes).

The underlayer compositions of the invention may be prepared by combining the polymer, acid generator, and any other desired ingredients using conventional methods. The compositions of the invention advantageously may be formed into underlayers on a substrate by spin-coating followed by baking to achieve crosslinking and solvent removal. The baking is preferably conducted at about 250° C. or less, more preferably about 150-230° C. The baking time may be varied depending on the layer thickness and bake temperature. At 215° C., a baking time of about two minutes is preferred.

The thickness of the underlayer composition of the invention may be varied depending on the underlying topography and the intended etch protocol (for etching the material layer to be patterned). The thickness is preferably about 0.15-5.0 µm.

The compositions of the invention are especially useful for lithographic processes used in the manufacture of integrated circuits on semiconductor substrates. The compositions are especially useful for lithographic processes using 193 nm or shorter wavelength UV imaging radiation.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over the material layer to be patterned, preferably by spin-coating. The composition is then baked to remove solvent and to cure (crosslink) the composition. A radiation-sensitive resist layer can then be applied (directly or indirectly) over the cured underlayer composition of the invention. The resist is preferably a silicon-containing resist imageable with the desired wavelength of radiation.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible provided that the thickness is substantially uniform and that the resist layer can withstand subsequent processing to transfer the lithographic pattern to the underlayer, such as by reactive ion etching. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., 193 nm ultraviolet radiation). Where scanning particle beams such as electron beam are used, patternwise exposure may be achieved by scanning the beam across the substrate and selectively applying the beam in the desired pattern. Where wavelike radiation forms such as 193 nm ultraviolet (UV) radiation are used, the patternwise exposure is conducted through a mask which is placed over the resist layer. For 193 nm UV radiation, the total exposure energy is preferably about 100 millijoules/cm² or less, more preferably about 50 millijoules cm² or less (e.g., 15-30 millijoules/cm²).

After the desired patternwise exposure, the resist layer is typically baked to further complete the acid-catalyzed reaction and to enhance the contrast of the exposed pattern. The post-exposure bake is preferably conducted at about 60-175° C., more preferably about 90-160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the underlayer of the invention by reactive ion etching or other suitable etch techniques known in the art.

After the opening of the underlayer of the invention, the underlying material layer to be patterned may then be etched using an etchant appropriate to the material layer composition. Alternatively, exposed portions of the material layer may be subjected to electroplating, metal deposition, ion implantation, or other semiconductor processing techniques. Once the desired pattern transfer has taken place, any remaining underlayer and resist may be removed using conventional stripping techniques.

Thus, the compositions of the invention and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

In the trilayer approach, the underlayer of this invention is first applied to the surface of the substrate, using a suitable deposition process such as spin-on coating. The underlayer preferably has a thickness of about 80 to about 8000 nm. Next, a silicon containing polymer interlayer is applied to the upper surface of the underlayer utilizing a conventional deposition process such as spin-on coating, evaporation, chemical vapor deposition, plasma-assisted chemical vapor deposition, or physical vapor deposition. The thickness of the interlayer is preferably about 10 to about 500 nm, more preferably about 20 to about 200 nm. The interlayer may include polysiloxane, polysilane, silylated novolak, Si doped PMMA, silicon-polyimide, and/or polyvinylsilylsulfone. Suitable interlayer materials are the silicon containing spin on ARC/hardmask materials described in U.S. Pat. Nos. 6,420,088; 6,503,692; and 6,730,454.

Examples of lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469; and 5,948,570. It should be understood, however, that the invention is not limited to any specific lithography technique or device structure.

EXAMPLE 1

Synthesis of copolymer of 2-vinylnaphthalene and 5-hydroxy-1-naphthalenyl methacrylate (VN/HNM(60/40))

1.01 g of 2-vinylnaphthalene, 1 g of 5-hydroxy-1-naphthalenyl methacrylate and 90 mg of 2,2'-azobis(2-methylpropionitrile) (AIBN) initiator were dissolved in 8.4 g of tetrahydrofuran (THF) and charged into a 3-neck flask. The system was then purged with $N_2$ for 30 minutes before the temperature was raised to 70° C. The reaction was carried out under $N_2$ overnight at 70° C. The solution was then precipitated in 1000 ml of deionized (DI) water. The polymer was collected and dried in vacuum oven overnight at 65° C. Yield was 96%.

EXAMPLE 2

Synthesis of terpolymer of 2-vinylnaphthalene, 5-hydroxy-1-naphthalenyl methacrylate and hydroxyethyl methacrylate (VN/HNM/HEMA(37.5/37.5/25))

0.68 g of 2-vinylnaphthalene, 1.01 g of 5-hydroxy-1-naphthalenyl methacrylate, 0.38 g of hydroxyethyl methacrylate and 101 mg of AIBN initiator were dissolved in 10.8 g of THF and charged into a 3-neck flask. The system was then purged with $N_2$ for 30 minutes before the temperature was raised to 72° C. The reaction was carried out under $N_2$ overnight at 72° C. The solution was then precipitated in 1000 ml of DI water. The polymer was collected and dried in vacuum oven overnight at 65° C. Yield was >90%.

EXAMPLE 3

Synthesis of homopolymer of 5-hydroxy-1-naphthalenyl methacrylate (HNM)

1.0 g of 5-hydroxy-1-naphthalenyl methacrylate and 36 mg of AIBN initiator were dissolved in 6 g of THF and charged into a 3-neck flask. The system was then purged with $N_2$ for 30 minutes before the temperature was raised to 72° C. The reaction was carried out under $N_2$ overnight at 72° C. The solution was then precipitated in 2000 ml of DI water. The polymer was collected and dried in vacuum oven overnight at 65° C.

EXAMPLE 4

Synthesis of homopolymer of 5-hydroxy-1-naphthalenyl methacrylate (HNM)

To a 250 ml 3-neck round bottom flask equipped with condenser, thermometer, a nitrogen inlet and a magnetic stirrer bar, the following were added: 5-hydroxy-1-naphthalenyl methacylate monomer (22.50 g, 0.098 mole), AIBN (0.98 g, 6% of total moles of monomers), n-DDT (0.39 g, 2% of total moles of monomers), and 90 g of methyl ethyl ketone (MEK) (20% wt-wt concentration). The reaction mixture was stirred at room temperature and bubbled with $N_2$ flow for 45 minutes prior to turning the heating mantle on. The reaction was conducted for 13 hours at 67-70° C. with a blanket $N_2$ flow. Then the reaction solution was cooled to room temperature, diluted with 25 g of MEK and added dropwise to stirring 900 ml of hexane (1:8). The slurry was stirred for two hours before filtration. Solid was air dried on the Buckner filter for 1.5 hours, redissolved in MEK (15% wt-wt) and reprecipitated in hexane (1:8). The slurry was stirred for two hours before filtration. The solid was collected and air dried for 2-3 hours before final drying that was carried out at vacuum oven at 60° C. overnight. Yield was 90%.

EXAMPLE 5

Formulation and Optical Properties

Each of the polymers synthesized in Examples 1-3 were dissolved in propylene glycol monomethyl ether acetate (PGMEA) in concentrations of 100 parts by weight. A crosslinking agent tetramethoxymethyl glycoluril in a concentration of 8 parts by weight and di(t-butylphenyl)iodoniumperfluorobutyl-sulfonate (DtBPI-PFBuS) in a concentration of 4 parts by weight were added to the solution, achieving 10 wt. % of total solids. The formulated solution was spin-coated on a silicon wafer baked on a hot plate at 215° C. for 180 seconds, then n and k values were measured with VB-250 VASE Ellipsometer manufactured by J. A. Woollam Co. Inc. The measured optical properties of the film for 193 nm radiation are shown in the following table.

| Sample | Polymer Composition | n at 193 nm | k at 193 nm |
|---|---|---|---|
| 1 | VN/HNM(60/40) | 1.3 | 0.25 |
| 2 | VN/HNM/HEMA(37.5/37.5/25) | 1.41 | 0.21 |
| 3 | HNM | 1.49 | 0.24 |

EXAMPLE 6

Reflectivity Calculation and Comparison Example

Reflectivity data of one polymer described in U.S. Patent Application Pub. No. 2002/0058204A1 were compared with the data of the underlayer compositions described in Example 5. A terpolymer of styrene, glycidylmethacrylate and isobornylmethacrylate with monomer ratio of 30:45:25, provided n value of 1.68 and k value of 0.48. The substrate reflectivities of this polymer (400 nm) under two bilayer resists with n and k values of 1.52, 0.03 and 1.66, 0.02 each were calculated. Both showed high reflectivity close to 2%, while Samples 2 and 3 of Example 5 exhibited low reflectivity ≦1%.

EXAMPLE 7

Lithography Patterning

The copolymer shown above was formulated with PGMEA casting solvent, commercial thermal acid generator (TAG) and commercially available crosslinking agent. The TAG was CDX-2178 from King Industries, and the crosslinker was Powderlink 1174 from DayChem Co, each added at 5 wt % relative to the solids. The TAG and crosslinking agent should be considered examples; many commercial embodiments can be used.

Films were spin cast on 200 mm silicon wafers on a TEL ACT8 lithography processing track. The solvent content and spin speed were adjusted to provide films of 200 nm thickness. The films were baked at 200° C. for 90 seconds to crosslink the polymer film. An experimental 193 nm silicon containing bilayer resist (high activation energy) was then spin-coated on the film to provide a thickness of 150 nm. Lithography exposures were performed with a 193 nm 0.75 NA optical scanner, with conventional illumination and a partial coherence of 0.6. An attenuated phase shift test reticle was used with 120 nm contact hole features. Exposure dose was varied to find the proper anchor dose for these features and cross section SEMs were obtained.

Successful 193 nm lithography with a bilayer resist and an underlayer of this invention were demonstrated. That is, the underlayer successfully crosslinked and became compatible with the spin on resist, and did not adversely affect the photoresist profile. The optical constants of the underlayer were also tuned for adequate reflectivity control. Note that this case is merely an example, and many other photoresists (including single layer 193 nm resists) and processing conditions can be used with equal success.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method of forming a patterned material feature on a substrate, said method comprising:
    providing a material layer on a substrate;
    forming an underlayer on said material layer, said underlayer comprising a vinyl or acrylate polymer, said polymer comprising (i) a monomer with at least one substituted or unsubstituted naphthalene or naphthol moiety, and (ii) a co-monomer with saturated carbon bonds, said co-monomer with saturated carbon bonds comprising a reactive site selected from the group consisting of amino groups, imino groups, and mixtures thereof;
    forming a radiation-sensitive imaging layer on said underlayer;
    patternwise exposing said imaging layer to radiation, thereby creating a pattern of radiation-exposed regions in said imaging layer;
    selectively removing portions of said imaging layer and underlayer to expose portions of said material layer; and
    etching said exposed portions of said material layer, thereby forming said patterned material feature.

2. The method of claim 1, further comprising:
    removing remaining portions of said imaging layer and said underlayer from said material layer.

3. The method of claim 1, wherein said radiation is ultraviolet radiation having a wavelength less than 200 nm.

4. The method of claim 1, wherein said imaging layer is a silicon-containing resist.

5. The method of claim 1, wherein said material layer is selected from the group consisting of dielectric materials, metals, and semiconductors.

6. The method of claim 1 wherein said underlayer further comprises a crosslinker.

7. A method of forming a patterned material feature on a substrate, said method comprising:
    providing a material layer on a substrate;
    forming an underlayer on said material layer, said underlayer comprising a vinyl or acrylate polymer, said polymer comprising (i) a monomer with at least one substituted or unsubstituted naphthalene or naphthol moiety, and (ii) a co-monomer with saturated carbon bonds, said co-monomer with saturated carbon bonds comprising a reactive site selected from the group consisting of amino groups, imino groups, and mixtures thereof;

forming an interlayer on said underlayer, said interlayer comprising a silicon-containing polymer;

forming a radiation-sensitive imaging layer on said interlayer;

patternwise exposing said imaging layer to radiation, thereby creating a pattern of radiation-exposed regions in said imaging layer;

selectively removing portions of said imaging layer, interlayer and underlayer to expose portions of said material layer; and etching said exposed portions of said material layer, thereby forming said patterned material feature.

8. The method of claim 7, wherein said interlayer comprises a material selected from the group consisting of polysiloxane, polysilane, silylated novolak, silicon-doped PMMA, silicon-polyimide, and polyvinylsilylsulfone.

9. The method of claim 7 wherein said underlayer further comprises a crosslinker.

* * * * *